(12) United States Patent
Endo et al.

(10) Patent No.: US 6,764,811 B2
(45) Date of Patent: Jul. 20, 2004

(54) PATTERN FORMATION METHOD

(75) Inventors: Masayuki Endo, Izumi (JP); Masaru Sasago, Hirakata (JP)

(73) Assignee: Matsushita Electric Industry Co., Ltd., Osaka (JP)

( * ) Notice: Subject to any disclaimer, the term of this patent is extended or adjusted under 35 U.S.C. 154(b) by 24 days.

(21) Appl. No.: 10/032,542

(22) Filed: Jan. 2, 2002

(65) Prior Publication Data

US 2002/0142251 A1 Oct. 3, 2002

(30) Foreign Application Priority Data

Mar. 28, 2001 (JP) ........................................ 2001-092180

(51) Int. Cl.⁷ ................................................. G03C 5/00
(52) U.S. Cl. .................. 430/322; 430/326; 430/270.1; 430/927
(58) Field of Search ................................ 430/322, 326, 430/270.1, 927

(56) References Cited

U.S. PATENT DOCUMENTS

| | | | | |
|---|---|---|---|---|
| 6,103,447 A | * | 8/2000 | Chen et al. | 430/270.1 |
| 6,251,560 B1 | * | 6/2001 | Wallow et al. | 430/270.1 |
| 6,280,898 B1 | * | 8/2001 | Hasegawa et al. | 430/270.1 |
| 2001/0026901 A1 | * | 10/2001 | Maeda et al. | 430/270.1 |

FOREIGN PATENT DOCUMENTS

JP          2001-222109          8/2001

* cited by examiner

*Primary Examiner*—Mark F. Hoff
*Assistant Examiner*—Daborah Chacko-Davis

(57) ABSTRACT

A resist film is formed from a chemically amplified resist material including a base polymer having a lactone group and having neither a hydroxyl group nor a carboxylic group as an adhesion group bonded to a polymer side chain; and an acid generator for generating an acid through irradiation with light. The resist film is irradiated with extreme UV of a wavelength of a 1 nm through 30 nm band for pattern exposure. The resist film is developed after the pattern exposure, so as to form a resist pattern from an unexposed portion of the resist film.

9 Claims, 3 Drawing Sheets

PATTERN FORMATION METHOD

BACKGROUND OF THE INVENTION

The present invention relates to a pattern formation method for forming a resist pattern made from an unexposed portion of a resist film of a chemically amplified resist material by irradiating the resist film with extreme UV of a wavelength of a 1 nm through 30 nm band through a mask.

In accordance with the increased degree of integration and downsizing of semiconductor integrated circuits, lithography technology is desired to be further developed in the process for semiconductor integrated circuit devices.

The exposing light for use in the lithography is now a mercury lamp, KrF excimer laser (of a wavelength of a 248 nm band) or ArF excimer laser (of a wavelength of a 193 nm band). However, for the generation of 0.1 $\mu$m or less, in particular the generation of 0.05 $\mu$m or less, use of extreme UV of a wavelength (of a 1 nm through 30 nm band) shorter than that of the ArF excimer laser is under examination.

In the lithography using the extreme UV as the exposing light, a chemically amplified resist material with high resolution and high sensitivity is preferably used.

Therefore, in the lithography using the extreme UV, a chemically amplified resist material suitably used in using the ArF excimer laser, whose wavelength is close to that of the extreme UV, is being examined to be used.

Now, a pattern formation method using a chemically amplified resist material suitable to the ArF excimer laser will be described with reference to FIGS. 3A through 3D.

First, a chemically amplified resist material having the following constituent is prepared:

Base polymer: poly((2-methyl-2-adamantyl methacrylate)-(methyl methacrylate)-(methacrylic acid)), wherein 2-methyl-2-admantyl methacrylate:methyl methacrylate:methacrylic acid=70 mol %:20 mol %:10 mol % . . . 2 g Acid generator: triphenylsulfonium triflate . . . 0.4 g Solvent: propylene glycol monomethyl ether acetate . . . 20 g Next, as shown in FIG. 3A, the chemically amplified resist material having the aforementioned constituent is applied on a semiconductor substrate 1, so as to form a resist film 2 with a thickness of 0.2 $\mu$m.

Then, as shown in FIG. 3B, the resist film 2 is irradiated with extreme UV 4 (of a wavelength of a 13 nm band) through a reflection mask (not shown) having a desired mask pattern for pattern exposure. After the pattern exposure, as shown in FIG. 3C, the resist film 2 is subjected to baking (PEB) with a hot plate at a temperature of 100° C. for 60 seconds.

In this manner, an exposed portion 2a of the resist film 2 becomes soluble in an alkaline developer owing to the function of an acid generated from the acid generator while an unexposed portion 2b of the resist film 2 remains refractory in the alkaline developer because no acid is generated from the acid generator.

Subsequently, the resist film 2 is developed with an alkaline developer, such as a 2.38 wt % tetramethylammonium hydroxide developer. Thus, a resist pattern 5 is formed from the unexposed portion 2b of the resist film 2 as shown in FIG. 3D.

However, since the exposed portion 2a of the resist film 2 is irradiated with the extreme UV 4 with high energy during the pattern exposure, a crosslinking reaction is caused in the base polymer in the exposed portion 2a of the resist film 2. Therefore, the exposed portion 2a of the resist film 2 cannot be completely dissolved in the alkaline developer, resulting in forming the resist pattern 5 in a defective shape as shown in FIG. 3D.

When the resist pattern 5 is in a defective shape, the shape of an interconnect pattern formed by using the resist pattern 5 as a mask also becomes defective, which leads to a problem of poor yield of semiconductor devices.

SUMMARY OF THE INVENTION

In consideration of the aforementioned conventional problem, an object of the invention is forming a resist pattern made from an unexposed portion of a resist film in a good shape by suppressing a crosslinking reaction in an exposed portion of the resist film although pattern exposure is carried out through irradiation with extreme UV with high energy.

In order to overcome the problem, the first pattern formation method of this invention comprises the steps of forming a resist film of a chemically amplified resist material including a base polymer having a lactone group and having neither a hydroxyl group nor a carboxylic group as an adhesion group bonded to a polymer side chain, and an acid generator for generating an acid through irradiation with light; irradiating the resist film with extreme UV of a wavelength of a 1 nm through 30 nm band for pattern exposure; and forming a resist pattern from an unexposed portion of the resist film by developing the resist film after the pattern exposure.

In the first pattern formation method, an adhesion group has a lactone group but has neither a hydroxyl group nor a carboxyl group, and the ring structure of the lactone group has no end and includes no OH group. Therefore, excitation of an OH group at the end of the adhesion group can be avoided in the exposed portion of the resist film subjected to the pattern exposure using the extreme UV, and hence, radicals are minimally generated. Accordingly, since a crosslinking reaction is minimally caused within the base polymer and between polymers, the exposed portion of the resist film can be definitely dissolved in an alkaline developer. As a result, the resist pattern can be formed in a good pattern shape.

In the first pattern formation method, the lactone group is preferably a γ-butyrolactone group, a δ-butyrolactone group, a mevalonic lactone group or an adamantyl lactone group.

Thus, although the exposed portion of the resist film is irradiated with the extreme UV, the excitation of the OH group at the end of the adhesion group can be definitely avoided, so as to definitely improve the solubility of the exposed portion in the alkaline developer.

In the first pattern formation method, the chemically amplified resist material preferably has an aromatic compound that does not generate an acid through irradiation with the extreme UV.

Thus, radicals generated from the base polymer through the extreme UV irradiation and concerned with the crosslinking reaction are captured by the aromatic compound in the exposed portion of the resist film, so that the number of radicals concerned with the crosslinking reaction can be reduced. As a result, the exposed portion of the resist film can be more easily dissolved in the alkaline developer.

In order to solve the problem, the second pattern formation method of this invention comprises the steps of forming a resist film of a chemically amplified resist material including a base polymer, an acid generator for generating an acid through irradiation with light and an aromatic compound that does not generate an acid through irradiation with light; irradiating the resist film with extreme UV of a wavelength of a 1 nm through 30 nm band through a mask for pattern exposure; and forming a resist pattern from an unexposed portion of the resist film by developing the resist film after the pattern exposure.

In the second pattern formation method, although radicals concerned with the crosslinking reaction are generated through the extreme UV irradiation in the exposed portion of the resist film, the radicals are captured by the aromatic compound, and the captured radicals are not diverted to acid generation. Accordingly, the number of radicals generated from the base polymer and concerned with the crosslinking reaction can be reduced, and hence, the crosslinking reaction is minimally caused and the exposed portion of the resist film can be definitely dissolved in an alkaline developer. As a result, the resist pattern can be formed in a good pattern shape.

The aromatic compound included in the chemically amplified resist material used in the first or second pattern formation method is preferably styrene, aniline, methoxybenzene, methoxystyrene, methylstyrene, hydroxybenzene or hydroxystyrene.

Thus, the radicals generated in the exposed portion of the resist film and concerned with the crosslinking reaction can be definitely captured by the aromatic compound. Therefore, the number of radicals concerned with the crosslinking reaction can be definitely reduced, so that the exposed portion of the resist film can be further easily dissolved in the alkaline developer.

In the second pattern formation method, the base polymer preferably includes no aromatic.

Thus, the number of radicals generated from the base polymer in the exposed portion of the resist film and concerned with the crosslinking reaction is further reduced, so that the solubility of the exposed portion of the resist film in the alkaline developer can be further improved.

In the first or second pattern formation method, the extreme UV preferably has a wavelength of a 13 nm band.

Thus, a fine resist pattern can be formed by using extreme UV currently planned to be put to practical use.

DETAILED DESCRIPTION OF THE INVENTION

Embodiment 1

A pattern formation method according to Embodiment 1 of the invention will now be described with reference to FIGS. 1A through 1D.

Figure 1A:
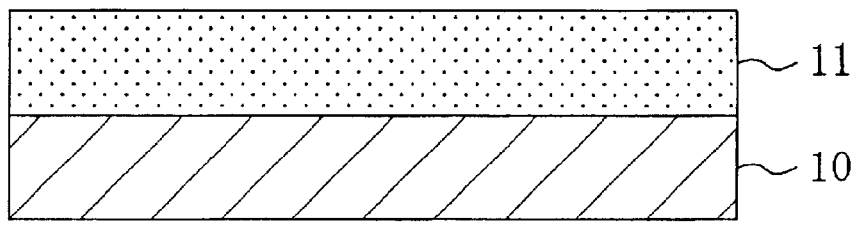
FIGS. 1A, 1B, 1C and 1D are cross-sectional views for showing procedures in a pattern formation method according to Embodiment 1 of the invention.

First, a chemically amplified resist material having the following constituent is prepared:

Base polymer: poly((2-methyl-2-adamantyl methyl methacrylate)-(γ-butyrolactyl methacrylate)), wherein 2-methyl-2-adamantyl methyl methacrylate:γ-butyrolactyl methacrylate=50 mol %:50 mol % . . . 2 g Acid generator: triphenylsulfonium triflate . . . 0.4 g Solvent: propylene glycol monomethyl ether acetate . . . 20 g Next, as shown in FIG. 1A, the chemically amplified resist material having the aforementioned constituent is applied on a semiconductor substrate 10, so as to form a resist film 11 with a thickness of 0.2 μm.

Figure 1B:
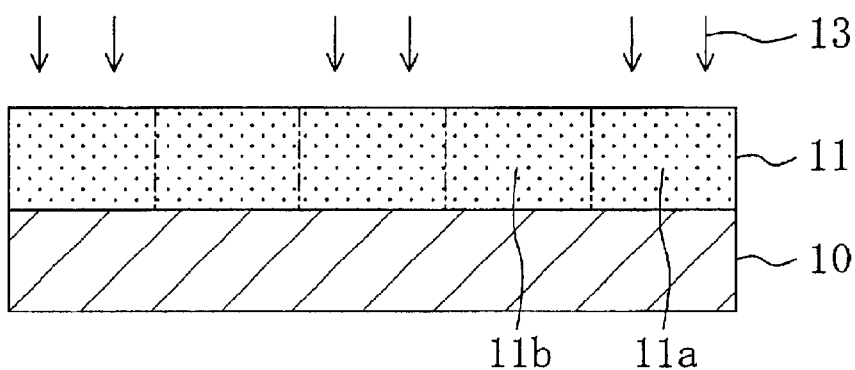
Figure 1C:
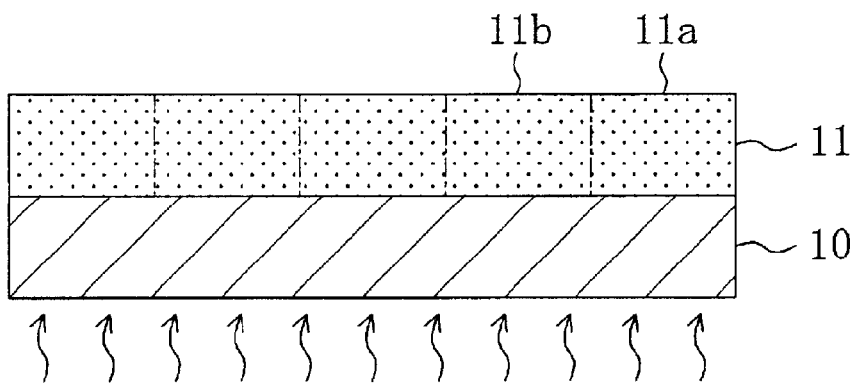

Then, as shown in FIG. 1B, the resist film 11 is irradiated with extreme UV 13 (of a wavelength of a 13 nm band) through a reflection mask (not shown) having a desired mask pattern for pattern exposure. After the pattern exposure, the resist film 11 is subjected to baking (PEB) with a hot plate at a temperature of 100° C. for 60 seconds as shown in FIG. 1C.

In this manner, an exposed portion 11a of the resist film 11 becomes soluble in an alkaline developer owing to the function of an acid generated from the acid generator while an unexposed portion 11b of the resist film 11 remains refractory in the alkaline developer because no acid is generated from the acid generator. In this case, since an adhesion group bonded to a side chain of the base polymer has a lactone group but has neither a hydroxyl group nor a carboxyl group, although the exposed portion 11a of the resist film 11 is irradiated with the extreme UV 13, a crosslinking reaction is minimally caused. Therefore, the solubility of the exposed portion 11a in an alkaline developer can be improved. The reason is as follows:

An adhesion group is generally bonded to the side chain of the base polymer for improving the adhesion between the resist film 11 and the semiconductor substrate 10. When the adhesion group has a hydroxyl group or a carboxyl group, the OH group at the end of the adhesion group is excited so as to easily generate radicals through the irradiation with the extreme UV. Therefore, a crosslinking reaction can be caused within the base polymer or between polymers. As a result, the exposed portion 11a of the resist film 11 is difficult to solve in an alkaline developer.

In Embodiment 1, however, the adhesion group has a lactone group but has neither a hydroxyl group nor a carboxyl group, and a lactone group has a ring structure with no end and includes no OH group. Therefore, even when the exposed portion 11a of the resist film 11 is irradiated with the extreme UV, the excitation of the OH group at the end of the adhesion group can be avoided, and hence, radicals are minimally generated. Accordingly, the crosslinking reaction is minimally caused within the base polymer or between polymers, so that the exposed portion 11a of the resist film 11 can be definitely dissolved in an alkaline developer.

Subsequently, the resist film 11 is developed with an alkaline developer, such as a 2.38 wt % tetramethylammonium hydroxide developer. Thus, a resist pattern 14 with a line width of 0.07 μm is formed from the unexposed portion 11b of the resist film 11 as shown in FIG. 1D.

Figure 1D:
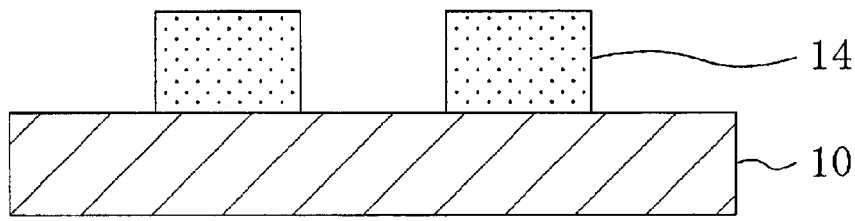

According to Embodiment 1, since the exposed portion 11a of the resist film 11 can be definitely dissolved in an alkaline developer as described above, the resist pattern 14 can be formed in a good pattern shape as shown in FIG. 1D.

Embodiment 2

A pattern formation method according to Embodiment 2 of the invention will now be described with reference to FIGS. 2A through 2D.

Figure 2A:
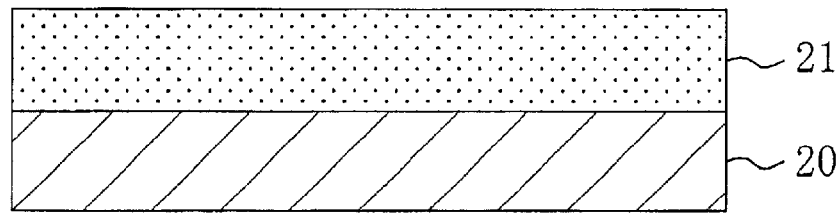
FIGS. 2A, 2B, 2C and 2D are cross-sectional views for showing procedures in a pattern formation method according to Embodiment 2 of the invention.

First, a chemically amplified resist material having the following constituent is prepared:

Base polymer: poly((2-methyl-2-adamantyl acrylate)-(methyl methacrylate)-(methacrylic acid)), wherein 2-methyl-2-adamantyl acrylate:methyl methacrylate-
:methacrylic acid=70 mol %:20 mol %:10 mol % . . . 2 g Acid generator: triphenylsulfonium triflate . . . 0.4 g Solvent: propylene glycol monomethyl ether acetate . . . 20 g Aromatic compound not generating acid through extreme UV irradiation: styrene . . . 0.4 g Next, as shown in FIG. 2A, the chemically amplified resist material having the aforementioned constituent is applied on a semiconductor substrate 20, so as to form a resist film 21 with a thickness of 0.2 µm.

Figure 2B:
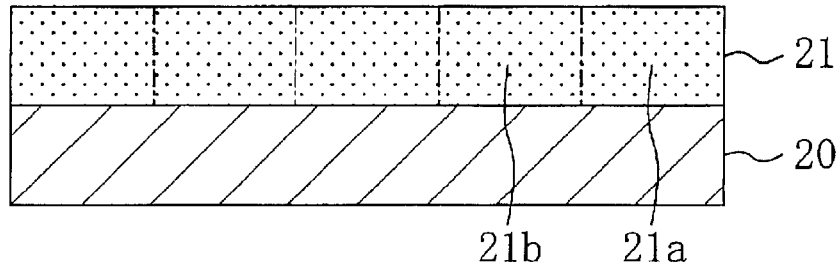
Figure 2C:
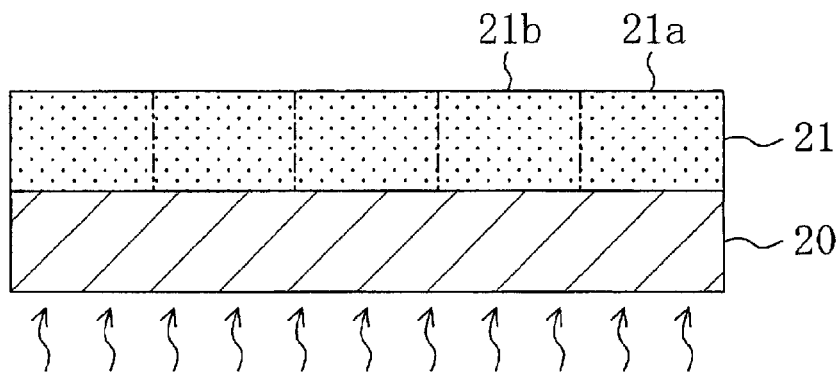

Then, as shown in FIG. 2B, the resist film 21 is irradiated with extreme UV 23 (of a wavelength of a 13 nm band) through a reflection mask (not shown) having a desired mask pattern for pattern exposure. After the pattern exposure, the resist film 21 is subjected to baking (PEB) with a hot plate at a temperature of 100° C. for 60 seconds as shown in FIG. 2C.

In this manner, an exposed portion 21a of the resist film 21 becomes soluble in an alkaline developer owing to the function of an acid generated from the acid generator while an unexposed portion 21b of the resist film 21 remains refractory in the alkaline developer because no acid is generated from the acid generator. In this case, since the chemically amplified resist material includes the aromatic compound that does not generate an acid through the extreme UV irradiation, although the exposed portion 21a of the resist film 21 is irradiated with the extreme UV 23, a crosslinking reaction is minimally caused. Therefore, the solubility of the exposed portion 21a in an alkaline developer can be improved. The reason is as follows:

When the resist film 21 is irradiated with the extreme UV, a variety of radicals including those concerned with the crosslinking reaction are generated from the base polymer, but these radicals are captured by the aromatic compound. In this case, although an aromatic compound that generates an acid through the extreme UV irradiation captures the radicals, the captured radicals are diverted to the acid generation. Therefore, the aromatic compound that generated an acid concerns with the crosslinking reaction. However, radicals captured by the aromatic compound that does not generate an acid through the extreme UV irradiation are not diverted to the acid generation, and hence, the aromatic compound that does not generate an acid does not concern with the crosslinking reaction.

Accordingly, in Embodiment 2, the number of radicals generated from the base polymer and concerned with the crosslinking reaction is reduced in the exposed portion 21a of the resist film 21. Therefore, although the exposed portion 21a of the resist film 21 is irradiated with the extreme UV 23, the crosslinking reaction is minimally caused and the solubility of the exposed portion 21a in an alkaline developer can be improved. The effect of the aromatic compound that does not generate an acid can be exhibited when the content is approximately several % in a weight ratio to the base polymer, and the content may be several % or more.

Subsequently, the resist film 21 is developed with an alkaline developer, such as a 2.38 wt % tetramethylammonium hydroxide developer. Thus, a resist pattern 24 with a line width of 0.07 µm is formed from the unexposed portion 21b of the resist film 21 as shown in FIG. 2D.

Figure 2D:
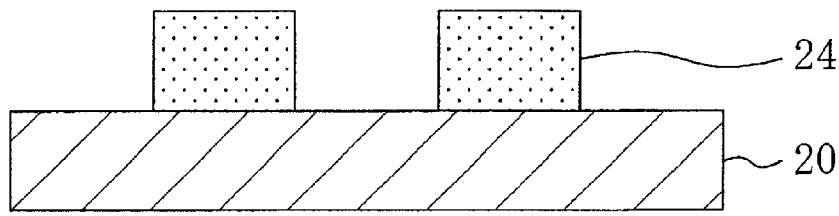
Figure 3A:
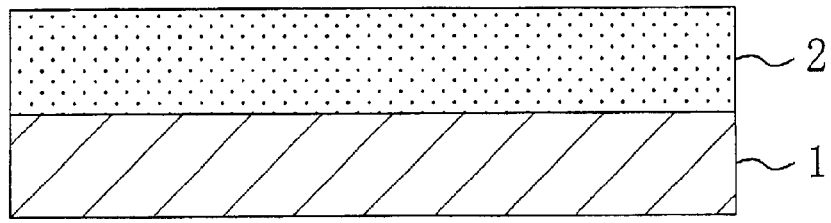
FIGS. 3A, 3B, 3C and 3D are cross-sectional views for showing procedures in a conventional pattern formation method.
Figure 3B:
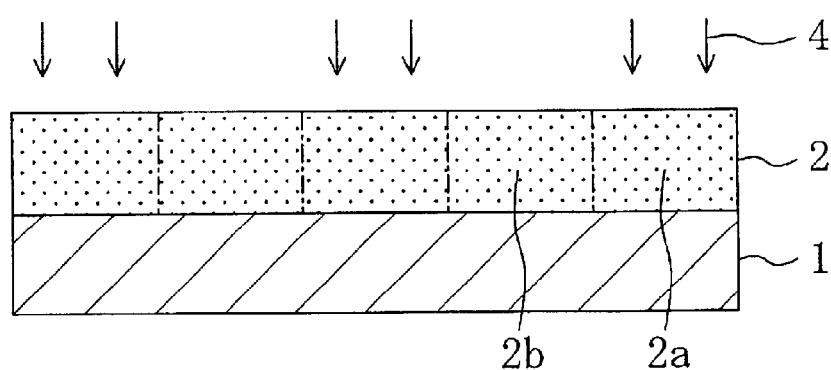
Figure 3C:
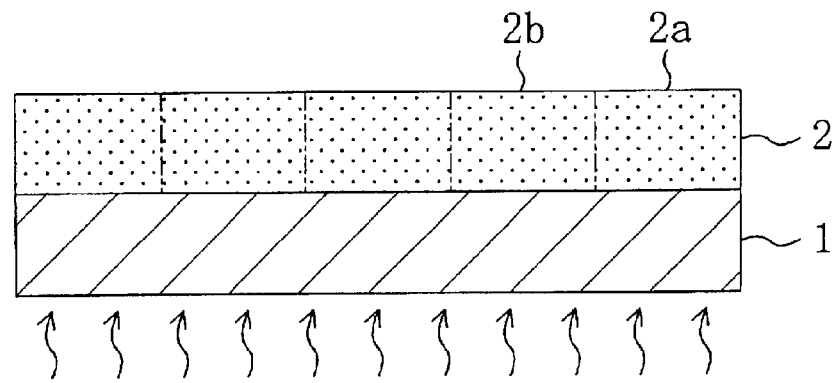
Figure 3D:
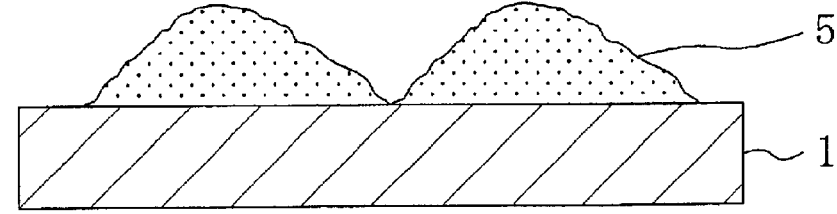

According to Embodiment 2, since the exposed portion 21a of the resist film 21 is definitely dissolved in an alkaline developer as described above, the resist pattern 24 can be formed in a good pattern shape as shown in FIG. 2D.

In particular, since the base polymer of Embodiment 2 does not include an aromatic compound that generates an acid through the extreme UV irradiation, the number of radicals generated from the base polymer and concerned with the crosslinking reaction can be further reduced in the exposed portion 21a of the resist film 21, so as to further suppress the crosslinking reaction. Accordingly, the solubility of the exposed portion 21a of the resist film 21 in an alkaline developer can be further improved, resulting in forming the resist pattern 24 in a better shape.

Although styrene is used as the aromatic compound that does not generate an acid through the extreme UV irradiation in Embodiment 2, aniline, methoxybenzene, methoxystyrene, methylstyrene, hydroxybenzene or hydroxystyrene may be used instead for capturing radicals generated from the base polymer and concerned with the crosslinking reaction.

Also, an adhesion group bonded to a side chain of the base polymer of Embodiment 2 has a carboxylic group. Instead, the adhesion group preferably has neither a hydroxyl group nor a carboxylic group but has a lactone group.

In this case, even when the exposed portion 21a of the resist film 21 is irradiated with the extreme UV, the excitation of the OH group at the end of the adhesion group can be avoided, and hence, radicals are minimally generated. Therefore, the crosslinking reaction is minimally caused within the base polymer or between polymers. As a result, the exposed portion 21a of the resist film 21 can be further easily dissolved in an alkaline developer, so as to further improve the shape of the resist pattern 24.

Although light of a wavelength of a 13 nm band is used as the extreme UV in Embodiments 1 and 2, light of a wavelength of a 5 nm band may be used instead.

What is claimed is:

1. A pattern formation method comprising the steps of:

forming a resist film of a chemically amplified resist material including a base polymer having a lactone group and having neither a hydroxyl group nor a carboxylic group, and an acid generator for generating an acid through irradiation with light;

irradiating said resist film with extreme UV of a wavelength of a 1 nm through 30 nm band for pattern exposure; and forming a resist pattern from an unexposed portion of said resist film by developing said resist film after the pattern exposure.

2. The pattern formation method of claim 1, wherein said lactone group is a γ-butyrolactone group, a δ-butyrolactone group, a mevalonic lactone group or an adamantyl lactone group.

3. The pattern formation method of claim 1, wherein said chemically amplified resist material has an aromatic compound that does not generate an acid through irradiation with said extreme UV.

4. The pattern formation method of claim 3, wherein said aromatic compound is styrene, aniline, methoxybenzene, methoxystyrene, methylstyrene, hydroxybenzene or hydroxystyrene.

5. The pattern formation method of claim 1, wherein said extreme UV has a wavelength of a 13 nm band.

6. A pattern formation method comprising the steps of:

forming a resist film of a chemically amplified resist material including a base polymer, an acid generator for generating an acid through irradiation with light and an aromatic compound that does not generate an acid through irradiation with light;

irradiating said resist film with extreme UV of a wavelength of a 1 nm through 30 nm band through a mask for pattern exposure; and forming a resist pattern from an unexposed portion of said resist film by developing said resist film after the pattern exposure.

7. The pattern formation method of claim 6, wherein said aromatic compound is styrene, aniline, methoxybenzene, methoxystyrene, methylstyrene, hydroxybenzene or hydroxystyrene.

8. The pattern formation method of claim 6, wherein said base polymer includes no aromatic compound.

9. The pattern formation method of claim 6, wherein said extreme UV has a wavelength of a 13 nm band.

* * * * *